United States Patent
Nagoshi et al.

(10) Patent No.: US 11,054,744 B2
(45) Date of Patent: Jul. 6, 2021

(54) PHOTOSENSITIVE ELEMENT, LAMINATE, PERMANENT MASK RESIST, METHOD FOR PRODUCING SAME, AND METHOD FOR PRODUCING SEMICONDUCTOR PACKAGE

(71) Applicant: HITACHI CHEMICAL COMPANY, LTD., Tokyo (JP)

(72) Inventors: Toshimasa Nagoshi, Tokyo (JP); Shigeo Tanaka, Tokyo (JP); Shizu Fukuzumi, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 437 days.

(21) Appl. No.: 15/306,408

(22) PCT Filed: Apr. 24, 2015

(86) PCT No.: PCT/JP2015/062550
§ 371 (c)(1),
(2) Date: Oct. 24, 2016

(87) PCT Pub. No.: WO2015/163455
PCT Pub. Date: Oct. 29, 2015

(65) Prior Publication Data
US 2017/0045817 A1 Feb. 16, 2017

(30) Foreign Application Priority Data
Apr. 25, 2014 (JP) .............................. JP2014-091284

(51) Int. Cl.
*G03F 7/09* (2006.01)
*G03F 7/029* (2006.01)
(Continued)

(52) U.S. Cl.
CPC ................ *G03F 7/09* (2013.01); *B32B 7/02* (2013.01); *B32B 27/38* (2013.01); *C09D 123/06* (2013.01);
(Continued)

(58) Field of Classification Search
CPC . G09F 7/09; G09F 7/26; G09F 7/2002; G09F 7/16; G09F 7/029; G09F 7/027;
(Continued)

(56) References Cited

U.S. PATENT DOCUMENTS

| | | | | |
|---|---|---|---|---|
| 2011/0223539 A1* | 9/2011 | Kurafuchi | ............ | G03F 7/0385 430/280.1 |
| 2014/0154628 A1* | 6/2014 | Nagoshi | ............... | G03F 7/0388 430/280.1 |

FOREIGN PATENT DOCUMENTS

| JP | 2000-330291 A | 11/2000 |
|---|---|---|
| JP | 2002-185132 A | 6/2002 |

(Continued)

OTHER PUBLICATIONS

Translation to English of JP2012027368 A. accessed Jan. 16, 2019 (Year: 2012).*

(Continued)

*Primary Examiner* — Nancy R Johnson
(74) *Attorney, Agent, or Firm* — Fitch, Even, Tabin & Flannery, LLP

(57) ABSTRACT

Provided is a photosensitive element including a support film, and a photosensitive layer provided on the support film and formed from a photosensitive resin composition, in which the surface roughness of the surface of the support film that is in contact with the photosensitive layer is 200 to 4,000 nm.

19 Claims, 4 Drawing Sheets

(51) Int. Cl.
  *G03F 7/004* (2006.01)
  *B32B 27/38* (2006.01)
  *B32B 7/02* (2019.01)
  *G03F 7/027* (2006.01)
  *H01L 23/498* (2006.01)
  *C09D 123/06* (2006.01)
  *G03F 7/16* (2006.01)
  *G03F 7/20* (2006.01)
  *G03F 7/26* (2006.01)
  *H01L 23/29* (2006.01)
  *H01L 23/31* (2006.01)
  *H05K 3/28* (2006.01)

(52) U.S. Cl.
  CPC ............. *G03F 7/004* (2013.01); *G03F 7/027* (2013.01); *G03F 7/029* (2013.01); *G03F 7/16* (2013.01); *G03F 7/2002* (2013.01); *G03F 7/26* (2013.01); *H01L 23/293* (2013.01); *H01L 23/3142* (2013.01); *H01L 23/49894* (2013.01); *H01L 23/3128* (2013.01); *H01L 2224/0401* (2013.01); *H01L 2224/04042* (2013.01); *H01L 2224/16235* (2013.01); *H01L 2224/16237* (2013.01); *H01L 2224/32225* (2013.01); *H01L 2224/48091* (2013.01); *H01L 2224/48229* (2013.01); *H01L 2224/73204* (2013.01); *H01L 2224/73265* (2013.01); *H01L 2224/92125* (2013.01); *H01L 2924/15311* (2013.01); *H01L 2924/15313* (2013.01); *H05K 3/287* (2013.01)

(58) Field of Classification Search
  CPC . G09F 7/004; C09D 123/06; H01L 23/49894; H01L 23/3142; H01L 23/293; H01L 23/3128; H01L 2324/15313; H01L 2924/15311; H01L 2224/92125; H01L 2224/73265; H01L 2224/73204; H01L 2224/48229; H01L 2224/48091; H01L 2224/32225; H01L 2224/16237; H01L 2224/16235; H01L 2224/04042; H01L 2224/0401; B32B 7/02; B32B 27/38; H05K 3/287
  See application file for complete search history.

(56) References Cited

FOREIGN PATENT DOCUMENTS

| | | | | |
|---|---|---|---|---|
| JP | 2005-292581 A | 10/2005 | | |
| JP | 2006-201546 A | 8/2006 | | |
| JP | 2006-220886 A | 8/2006 | | |
| JP | 2007-041493 A | 2/2007 | | |
| JP | 2007-178500 A | 7/2007 | | |
| JP | 2007322485 A | * | 12/2007 | ........... G03F 7/0007 |
| JP | 2010-085513 A | 4/2010 | | |
| JP | 2011-013622 A | 1/2011 | | |
| JP | 2012-027368 A | 2/2012 | | |
| WO | 2006/059534 A1 | 6/2006 | | |
| WO | WO-2013022068 A1 | * | 2/2013 | ............. G03F 7/038 |

OTHER PUBLICATIONS

Espacenet translation to English of JP2010085513 A. accessed May 8, 2019. (Year: 2010).*
Espacenet translation to English of JP2007178500 A. accessed May 8, 2019. (Year: 2010).*
Translation to English for JP 2007-322485 A via espacenet. accessed Aug. 12, 2020 (Year: 2007).*
International Search Report of Patent Application No. PCT/JP2015/062550 dated Jul. 28, 2015 in English.
International Preliminary Report On Patentability (IPRP) of WO Patent Application No. PCT/JP2015/062550 dated Nov. 3, 2916 in English.

* cited by examiner

PHOTOSENSITIVE ELEMENT, LAMINATE, PERMANENT MASK RESIST, METHOD FOR PRODUCING SAME, AND METHOD FOR PRODUCING SEMICONDUCTOR PACKAGE

TECHNICAL FIELD

The present disclosure relates to a photosensitive element, a laminate, a permanent mask resist using this laminate, a method for producing the permanent mask resist, and a method for producing a semiconductor package. More particularly, the present disclosure relates to a photosensitive element that is suitably used as a photosensitive insulating material used for semiconductor packaging.

BACKGROUND ART

Along with performance enhancement in various electronic apparatuses, high integration of semiconductor devices is in progress. Accordingly, there is a demand that various performances be imparted to permanent mask resists (solder resists), which are formed on printed wiring boards, semiconductor package substrates and the like.

For example, in Patent Literature 1, a balance is achieved between high resolution and low thermal expansion, by means of a permanent mask resist that uses a photosensitive resin composition including nano-sized silica as an inorganic filler material.

CITATION LIST

Patent Literature

Patent Literature 1: Japanese Unexamined Patent Publication No. 2011-013622

SUMMARY OF INVENTION

Technical Problem

However, along with high integration of semiconductor devices, there are an increasing number of cases in which other materials are further laminated on a permanent mask resist. Therefore, it is desirable that the material used as a permanent mask resist has excellent adhesiveness to other materials that are laminated, for example, a sealant material, an underfill, and copper. However, in regard to conventional photosensitive resin compositions such as that of Patent Literature 1, there is still room for improvement in the adhesiveness to other materials.

Thus, an object of the present disclosure is to provide a photosensitive element which can form a permanent mask resist having excellent adhesiveness to different kinds of materials. Another object of the present disclosure is to provide a permanent mask resist using this photosensitive element, a method for forming a permanent mask resist, a laminate, and a method for producing a semiconductor package.

Solution to Problem

The present disclosure provides a photosensitive element including a support film and a photosensitive layer that is provided on the support film and is formed from a photosensitive resin composition, in which the surface of the support film that is in contact with the photosensitive layer has a surface roughness Ra of 200 to 4,000 nm.

When such a photosensitive element is used, the permanent mask resist formed therefrom has excellent adhesiveness to different kinds of materials.

The support film may have a haze of 60% or higher.

The photosensitive resin composition may include a polyfunctional epoxy resin. Thereby, the surface unevenness attributable to the surface roughness on the support film is likely to remain as it is, and the effects described in the present disclosure may be provided more effectively.

The photosensitive resin composition may include an inorganic filler material having an average particle size of 1 µm or less at a proportion of 10% to 90% by mass. In a case in which an inorganic filler material having a small diameter is highly filled, adhesiveness may be easily deteriorated; however, when the photosensitive resin composition is combined with the support film according to the present disclosure, deterioration of adhesiveness can be sufficiently prevented.

The photosensitive resin composition described above may include a photoreactive compound having a (meth)acryloyl group, and may further include an acylphosphine-based compound. In regard to a photosensitive resin composition including a photoreactive compound having a (meth)acryloyl group, an acylphosphine-based compound has excellent bottom curability and has a feature that the compound is not easily subjected to oxygen inhibition. Therefore, after a step of forming a photosensitive layer, which will be described below, and before a step of forming a photocured part, a step of peeling the support film is included, and the photosensitive resin composition can be suitably applied to a method for forming a permanent mask resist that is relatively susceptible to the influence of oxygen. In addition, since the acylphosphine-based compound has excellent bottom curability, it is effective even when the acylphosphine-based compound is used in a photosensitive resin composition that has been colored by means of a pigment or the like, and the photosensitive resin composition can also be suitably applied to a solder resist that is used in the outermost layer of a substrate for semiconductor packaging.

The present disclosure also provides a method for forming a permanent mask resist, the method including a step of forming a photosensitive layer on a substrate using the photosensitive element described above; a step of irradiating a predetermined part of the photosensitive layer with active light rays, and forming a photocured part; and a step of removing regions other than the photocured part, and a permanent mask resist formed by this method.

When such a forming method is used, since the photosensitive element of the present disclosure is used, a permanent mask resist having excellent adhesiveness to different kinds of materials can be formed.

In regard to the method for forming a permanent mask resist described above, the method may further include a step of peeling the support film, after the step of forming a photosensitive layer and before the step of forming the photocured part. Furthermore, in regard to the method for forming a permanent mask resist, during the step of forming a photocured part, the photosensitive layer may be irradiated with active light rays using a direct drawing system, a projection exposure system, or an exposure system by which a negative mask is disposed such that the negative mask is not brought into direct contact with the photosensitive layer.

The photosensitive element described in the present disclosure has the support film peeled off before exposure as described above, and the photosensitive element can be particularly suitably applied in a case in which the photosensitive layer is exposed by an exposure system in which a mask is not used, or by an exposure system in which the mask is not brought into contact with the photosensitive layer.

The method for forming a permanent mask resist may further include a heating step after the step of removing regions other than the photocured part. Thereby, the epoxy resin is cured, and reliability of the permanent mask resist can be enhanced.

The present disclosure also provides a method for producing a semiconductor package, the method including a step of forming other members on a substrate on which a permanent mask resist has been formed by the method for forming a permanent mask resist described above.

When such a forming method is used, since the method for forming a permanent mask resist described in the present disclosure is used, excellent adhesiveness to other members (different kinds of materials) is obtained.

The present disclosure provides a laminate including a substrate; and a cured product obtainable by curing a photosensitive resin composition on the substrate, in which the surface roughness Ra of the cured product on the surface on the opposite side of the substrate is 200 to 4,000 nm. Such a laminate has excellent adhesiveness to other members (different kinds of materials).

Advantageous Effects of Invention

According to the present disclosure, a photosensitive element which can form a permanent mask resist having excellent adhesiveness to different kinds of materials, particularly a sealant material, an underfill, copper sputter and the like, can be provided. According to the disclosure of the present disclosure, a permanent mask resist using this photosensitive element, a method for forming a permanent mask resist, a laminate, and a method for producing a semiconductor package can be further provided.

DESCRIPTION OF EMBODIMENTS

Figure 1:
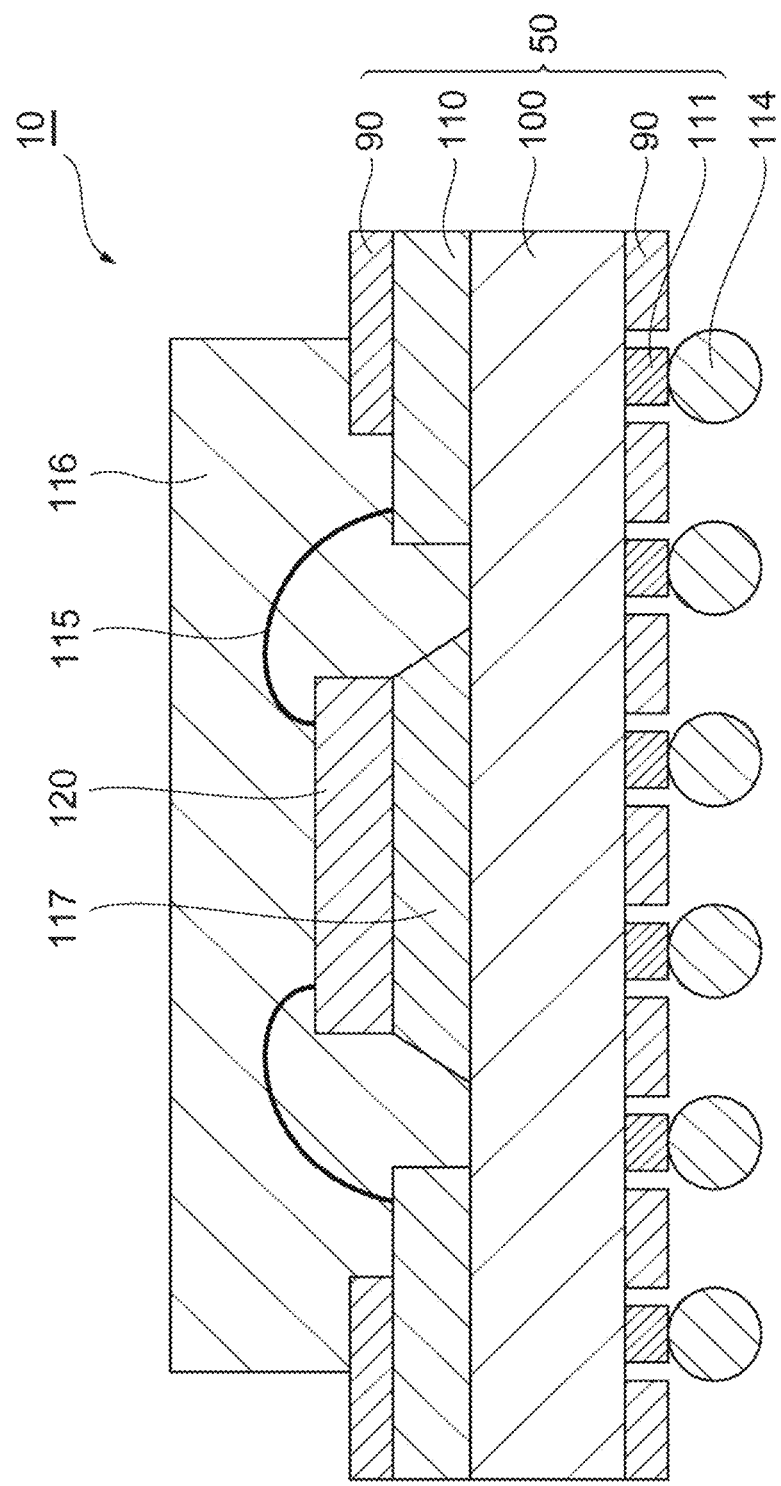
FIG. 1 is a schematic cross-sectional view of a semiconductor package substrate.

Hereinafter, embodiments of the present disclosure will be described in detail, with reference to the drawings as necessary. However, the present disclosure is not intended to be limited to the following embodiments. Meanwhile, the term "(meth)acrylate" as used in the present specification means "acrylate", or "methacrylate" corresponding thereto. The same also applies to similar expressions such as "(meth) acrylic acid". Furthermore, the term "layer" is meant to include a structure having a shape that is formed over the entire surface when observed in a plan view, as well as a structure having a shape that is formed in a portion. A numerical value range expressed using the symbol "~" represents a range that includes the numerical values described before and after the symbol "~" as the minimum value and the maximum value, respectively. In regard to the numerical value ranges described stepwise in the present specification, the upper limit or the lower limit of a numerical value range of a certain step may be substituted by the upper limit or the lower limit of a numerical value range of another step. Furthermore, in regard to a numerical value range described in the present specification, the upper limit or lower limit of the numerical value range may be substituted by a value disclosed in the Examples.

The photosensitive element of the present embodiment includes a support film and a photosensitive layer provided on the support film. The photosensitive element may have a protective film on the surface of the photosensitive layer on the opposite side of the support film.

Regarding the support film, the surface roughness Ra of the surface that is in contact with the photosensitive layer is 200 to 4,000 nm, and the surface roughness may be 200 to 2,000 nm, or may also be 250 to 1,000 nm. If the Ra is less than 200 nm, sufficient adhesiveness may not be obtained. On the other hand, if the Ra is larger than 4,000 nm, tackiness becomes strong when the support film is peeled off, and it is difficult to peel off the support film. Also, the support film may be such that the surface roughness Ra of the surface that is in contact with the photosensitive layer is larger than 500 nm and 4,000 nm or less.

Meanwhile, the "surface roughness" as used in the present specification refers to the arithmetic average roughness Ra. The arithmetic average roughness Ra means a value determinable by the following expression and expressed in nanometers (nm), when only a reference length (L) is sampled from a roughness curve in the direction of the mean line of the roughness curve, and the roughness curve is represented by the equation: y=f(x), while taking the X-axis in the direction of the mean line of this sampled portion, and taking the Y-axis in the direction of longitudinal magnification. That is, Ra is a value represented by the following formula (1).

[Math. 1]

$$Ra = \frac{1}{L}\int_0^L |f(x)|\, dx \quad (1)$$

The surface roughness of the support film can be adjusted by a conventionally known method; however, for example, the surface roughness may also be adjusted by a kneaded mat type method (a method of kneading a lubricating material into the support film), a sand blast type method, or a metal emboss processing type method.

Furthermore, there are no particular limitations on the thickness of the support film to be used; however, the thickness may be in the range of 10 μm to 200 μm, and may also be in the range of 12 μm to 100 μm. When the thickness is 10 μm or more, productivity at the time of applying the support film is enhanced, and when the thickness is 200 μm or less, economic efficiency tends to increase.

Examples of the support film include polymer films having heat resistance and solvent resistance, such as a polyethylene terephthalate film, a polyethylene film, a polypropylene film, and polycarbonate film. From the viewpoint that the effect described in the present disclosure can be more easily provided, the haze of the support film may be 60% or higher, and the degree of glossiness may be 10% or higher. The haze may be 70% or higher, and the degree of glossiness may be 20% or higher.

Next, the photosensitive layer will be explained. Regarding the photosensitive resin composition that forms the photosensitive layer, photosensitive resin compositions generally obtainable by photoradical polymerization, photocation polymerization, and other methods can all be used. Among them, a photocation polymerization-based resin composition with reduced oxygen inhibition can be particularly suitably used. Regarding such a resin composition, examples include a photocation polymerization initiator, and compounds including an epoxy resin or an oxetane resin. Particularly, a resin composition including an epoxy resin is effective in view of adhesiveness and heat resistance, and is adequate for satisfying various reliabilities in semiconductor package applications.

Furthermore, it is also effective for a photoradical polymerization-based resin composition. Such a resin composition may be, for example, a resin composition including: (a) a photosensitive prepolymer having at least one ethylenically unsaturated group and a carboxyl group in the molecule, (b) a photopolymerization initiator, (c) a photoreactive compound, (d) a polyfunctional epoxy resin, and (e) an inorganic filler material.

The photosensitive prepolymer having at least one ethylenically unsaturated group and a carboxyl group in the molecule of (a) (hereinafter, also referred to as "(a) photosensitive prepolymer") will be explained. The (a) photosensitive prepolymer may be any resin having at least one ethylenically unsaturated group and a carboxyl group in the molecule; however, for example, a reaction product obtained by adding a saturated or unsaturated polybasic acid anhydride (a3) to an esterification product of an epoxy resin (a1) and an unsaturated monocarbxylic acid (a2), or the like can be used. These compounds can be obtained by the following two-staged reaction. In the initial reaction (hereinafter, conveniently referred to as "first reaction"), an epoxy resin (a1) reacts with an unsaturated monocarboxylic acid (a2). In the subsequent reaction (hereinafter, conveniently referred to as "second reaction"), the esterification product produced in the first reaction reacts with a saturated or unsaturated polybasic acid anhydride (a3). The epoxy resin (a1) is not particularly limited; however, examples thereof include a bisphenol type epoxy resin, a novolac type epoxy resin, a biphenyl type epoxy resin, and a polyfunctional epoxy resin. The bisphenol type epoxy resin is suitably a resin obtainable by reacting bisphenol A type, bisphenol F type or bisphenol S type with epichlorohydrin. Epoxy resins such as bisphenol A type, bisphenol F type, hydrogenated bisphenol A type, and amino group-containing alicyclic or polybutadene-modified epoxy resins, such as GY-260, GY-255, and XB-2615 manufactured by BASF SE; Epikote 828, 1007, and 807 manufactured by Mitsubishi Chemical Corporation are suitably used.

Examples of the unsaturated monocarboxylic acid (a2) include (meth)acrylic acid, crotonic acid, cinnamic acid, and a reaction product between a saturated or unsaturated polybasic acid anhydride, and a semiester compound between a (meth)acrylate having one hydroxyl group in one molecule or a saturated or unsaturated dibasic acid and an unsaturated monoglycidyl compound. Examples of this reaction product include reaction products obtainable by reacting phthalic acid, tetrahydrophthalic acid, hexahydrophthalic acid, maleic acid, succinic acid and the like, and hydroxyethyl (meth)acrylate, hydroxypropyl (meth)acrylate, tris(hydroxyethyl) isocyanurate di(meth)acrylate, glycidyl (meth)acrylate, and the like, at an equimolar ratio by a conventional method. These unsaturated monocarboxylic acids can be sued singly or as mixtures. Among these, acrylic acid may also be used.

Examples of the saturated or unsaturated polybasic acid anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, itaconic anhydride, and trimellitic anhydride.

Regarding the photosensitive prepolymer described above, CCR-1218H, CCR-1159H, CCR-1222H, PCR-1050, TCR-1335H, ZAR-1035, ZAR-2001H, ZFR-1185 and ZCR-1569H, UXE-3024 (all manufactured by Nippon Kayaku Co., Ltd., trade names), EXP-2810 (manufactured by DIC Corporation, trade name), and the like are commercially available.

The (a) photosensitive prepolymers are used singly or in combination of two or more kinds. The refractive index of the resin may vary greatly depending on the structure of the resin used; however, in a case in which a compound having the above-described structure is used, the refractive index is 1.4 to 1.7, and in many cases, the refractive index is close to 1.57, which is the refractive index of a bisphenol A type epoxy resin. When a resin having a refractive index of 1.5 to 1.6 is used, the effects of the present embodiment are exhibited most effectively.

The acid value of the (a) photosensitive prepolymer may be 20 to 180 mg KOH/g, may be 30 to 150 mg KOH/g, or may be 40 to 120 mg KOH/g. Thereby, satisfactory developability of the photosensitive resin composition using an aqueous alkali solution is obtained, and excellent resolution may be obtained.

Here, the acid value can be measured by the following method. First, about 1 g of a resin solution to be measured is precisely weighed, subsequently 30 g of acetone is added to the resin solution, and the resin solution is dissolved uniformly. Subsequently, phenolphthalein, which is an indicator, is added in an appropriate amount to the solution, and titration is performed using a 0.1 N aqueous solution of KOH. Then, the acid value is calculated by the following formula. $A = 10 \times Vf \times 56.1/(Wp \times l)$.

In the formula, A represents the acid value (mg KOH/g); Vf represents the titer (mL) of phenolphthalein; Wp represents the weight (g) of the resin solution to be measured; and l represents the proportion (mass %) of non-volatile components in the resin solution to be measured.

Furthermore, the weight average molecular weight of the (a) photosensitive prepolymer may be 3,000 to 30,000, may be 5,000 to 20,000, or may be 7,000 to 15,000, from the viewpoint of coating properties.

Meanwhile, the weight average molecular weight (Mw) can be determined from values determined by gel permeation chromatography (GPC) and calculated relative to polystyrene standards.

Examples of the (b) photopolymerization initiator include aromatic ketones such as benzophenone, N,N,N',N'-tetraalkyl-4,4'-diaminobenzophenone, 2-benzyl-2-dimethylamino-1-(4-morpholinophenyl)-butanone-1,2-meth yl-1-[4-(methylthio)phenyl]-2-morpholinopropanone-1, 4,4'-(bis(dimethylamino)benzophenone (Michler's ketone)), 4,4'-bis(diethylamino)benzophenone, and 4-methoxy-4'-dimethylaminobenzophenone; quinones such as alkylanthraquinone and phenanthrenequinone; benzoin compounds such as benzoin and alkylbenzoin; benzoin ether compounds such as benzoin alkyl ether and benzoin phenyl ether; benzil derivatives such as benzyl dimethyl ketal;

2,4,5-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2,4-di(p-methoxyphenyl)-5-phenylimidazole dimer, and 2-(2,4-dimethoxyphenyl)-4,5-diphenylimidazole dimer; N-phenylglycine, N-phenyl glycine derivatives; acridine derivatives such as 9-phenylacridine; oxime esters such as 1,2-octanedione, 1-[4-(phenylthio)-,2-(O-benzoyl oxime)]; coumarin-based compounds such as 7-diethylamino-4-methylcoumarin; thioxanthone-based compounds such as 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; acylphosphine-based compounds such as 2,4,6-trimethylbenzoyl-diphenyl-phosphine oxide, bis(2,4,6-trimethylbenzoyl)-phenylphosphine oxide, and bis(2,6-dimethoxybenzoyl)-2,4,4-trimethyl-pentylphosphine oxide; bis(9-acridinyl) alkanes such as 9-phenylacridine, 9-aminoacridine, 9-pentylaminoacridine, 1,2-bis(9-acridinyl)ethane, 1,3-bis(9-acridinyl)propane, 1,4-bis(9-acridinyl)butane, 1,5-bis(9-acridinyl)pentane, 1,6-bis(9-acridinyl)hexane, 1,7-bis(9-acridinyl)heptane, 1,8-bis(9-acridinyl)octane, 1,9-bis(9-acridinyl)nonane, 1,10-bis(9-acridinyl)decane, 1,11-bis(9-acridinyl)undecane, and 1, 12-bis(9-acridinyl)dodecane; compounds having acridine rings, such as 9-phenylacridine, 9-pyridylacridine, 9-pyrazinylacridine, 9-monopentylaminoacridine, 1,3-bis(9-acridinyl)-2-oxapropane, 1,3-bis(9-acridinyl)-2-thiapropane, and 1,5-bis(9-acridinyl)-3-thiapentane; and compounds having oxime esters, such as (2-(acetyloxyiminomethyl)thioxanthen-9-one), N-[1-[4-(phenylthio)benzoyl]heptylidene-O-benzoylhydroxylamine, and O-acetyl-1-[6-(2-methylbenzoyl)-9-ethyl-9H-carbazol-3-yl]ethanone oxime. These can also be used in combination. Among these, acylphosphine-based compounds can also be used.

Regarding the (b) photopolymerization initiator, for example, IRGACURE 651, IRGACURE 184, IRGACURE 1173, IRGACURE 2959, IRGACURE 127, IRGACURE 907, IRGACURE 369, IRGACURE 379EG, IRGACURE 819, LUCIRIN TPO (all manufactured by BASF SE), DAROCURE-TPO (manufactured by BASF SE, trade name), and KAYACURE DETX-S(manufactured by Nippon Kayaku Co., Ltd., trade name) can be purchased as commercially available products.

Regarding the (c) photoreactive compound, a photopolymerizable monomer having two or more ethylenically unsaturated groups (may be (meth)acryloyl groups) in the molecule may be included, from the viewpoints of sensitivity and resolution. Photopolymerizable monomers are used singly or in combination of two or more kinds thereof; however, it is particularly desirable to include at least one or more kinds of polyfunctional photopolymerizable monomers each having three or more ethylenically unsaturated in one molecule. Among them, a polyfunctional photopolymerizable monomer having six or more ethylenically unsaturated groups in one molecule is effective for the enhancement of crack resistance at the time of reflow mounting. Examples of such a compound include dipentaerythritol hexaacrylate and structural analogues thereof, and KAYARAD DPHA, KAYARAD D-310, KAYARAD D-330, KAYARAD DPCA-20 and 30, and KAYARAD DPCA-60 and 120 (all manufactured by Nippon Kayaku Co., Ltd., trade names) are commercially available. Regarding a polyfunctional photopolymerizable monomer having three or more ethylenically unsaturated groups in one molecule, trimethylolpropane triethoxytriacrylate (SR-454, manufactured by Nippon Kayaku Co., Ltd., trade name) and the like are commercially available.

The other (c) photoreactive compound that can be used for the photosensitive resin composition of the present embodiment is not particularly limited, and compounds such as shown below can be used. However, among these, compounds having (meth)acryloyl groups can be used.

Examples thereof include a bisphenol A-based (meth)acrylate compound, a compound obtainable by reacting a polyhydric alcohol with an α,β-unsaturated carboxylic acid, a compound obtainable by reacting a glycidyl group-containing compound with an α,β-unsaturated carboxylic acid, a urethane monomer such as a (meth)acrylate compound having a urethane bond in the molecule, and a urethane oligomer. Furthermore, in addition to these, nonylphenoxy polyoxyethylene acrylate, phthalic acid-based compounds such as γ-chloro-β-hydroxypropyl-β'-(meth)acryloyloxy-ethyl-o-phthalate and β-hydroxyalkyl-β'-(meth)acryloyloxyalkyl-o-phthalate; (meth)acrylic acid alkyl esters, and EO-modified nonyl phenyl (meth)acrylate, and the like may be mentioned.

From the viewpoint of obtaining satisfactory alkali developability, a bisphenol A-based (meth)acrylate compound may be included. Examples of the bisphenol A-based (meth)acrylate compound include 2,2-bis(4-((meth)acryloxypolyethoxy)phenyl)propane, 2,2-bis(4-((meth)acryloxypolypropoxy)phenyl)propane, 2,2-bis(4-((meth)acryloxypolybutoxy)phenyl)propane, and 2,2-bis(4-((meth)acryloxypolyethoxypolypropoxy)phenyl)propane. These may be used singly or in combination of two or more kinds thereof.

Regarding the bisphenol A-based (meth)acrylate compound, 2,2-bis(4-(methacryloxypentaethoxy)phenyl)propane is commercially available as FA-321M (manufactured by Hitachi Chemical Company, Ltd., trade name) or BPE-500 (manufactured by Shin Nakamura Chemical Co., Ltd., trade name), and 2,2-bis(4-(methacryloxypentadecaethoxy)phenyl) is commercially available as BPE-1300 (manufactured by Shin Nakamura Chemical Co., Ltd., trade name).

Examples of the (d) epoxy resin include bisphenol A type epoxy resins such as bisphenol A diglycidyl ether; bisphenol F type epoxy resins such as bisphenol F diglycidyl ether; bisphenol S type epoxy resins such as bisphenol S diglycidyl ether; biphenol type epoxy resins such as biphenol diglycidyl ether; bixylenol type epoxy resins such as bixylenol diglycidyl ether; hydrogenated bisphenol A type epoxy resins such as hydrogenated bisphenol A glycidyl ether; dibasic acid-modified diglycidyl ether type epoxy resins thereof; biphenyl aralkyl type epoxy resins, and tris(2,3-epoxypropyl) isocyanurate. These are used singly or in combination of two or more kinds thereof.

Regarding these compounds, commercially available products can be used. Examples of the bisphenol A diglycidyl ether include Epikote 828, Epikote 1001, and Epikote 1002 (all manufactured by Mitsubishi Chemical Corporation, trade names). Examples of the bisphenol F diglycidyl ether include Epikote 807 (manufactured by Mitsubishi Chemical Corporation, trade name) and YSLV-80 (manufactured by NIPPON STEEL & SUMIKIN CHEMICAL CO., LTD., trade name), and examples of the bisphenol S diglycidyl ether include EBPS-200 (manufactured by Nippon Kayaku Co., Ltd., trade name) and EPICLON EXA-1514 (manufactured by DIC Corporation, trade name). Examples of the biphenol diglycidyl ether include YL6121 (manufactured by Mitsubishi Chemical Corporation, trade name), and examples of the bixylenol diglycidyl ether include YX4000H (manufactured by Mitsubishi Chemical Corporation, trade name). Furthermore, examples of the hydrogenated bisphenol A glycidyl ether include ST-2004 and ST-2007 (all manufactured by NIPPON STEEL & SUMIKIN CHEMICAL CO., LTD., trade names), and examples of the dibasic acid-modified diglycidyl ether type epoxy resin include ST-5100 and ST-5080 (all manufactured by NIPPON STEEL & SUMIKIN CHEMICAL CO., LTD., trade names). Examples of the biphenyl aralkyl type epoxy resin include NC-3000, NC-3000H (all manufactured by Nippon Kayaku Co., Ltd., trade names), examples of the tris(2,3-epoxypropyl) isocyanurate include TEPIC-S, TEPIC-VL and TEPIC-PASB26 (manufactured by Nissan Chemical Industries, Ltd.), and ARALDIDE TP810 (manufactured by BASF SE, trade name). In addition to them, examples further include JER157S (manufactured by Mitsubishi Chemical Corporation, trade name) and the like of bisphenol A-novolac type epoxy resins; JERYL-931 (manufactured by Mitsubishi Chemical Corporation, trade name), ARALDIDE 163 (manufactured by BASF SE) and the like of tetraphenylolethane type epoxy resins; ZX-1063 (manufactured by NIPPON STEEL & SUMIKIN CHEMICAL CO., LTD.) and the like of tetraglycidyl xylenoylethane resins; ESN-190, ESN-360 (manufactured by NIPPON STEEL & SUMIKIN CHEMICAL CO., LTD., trade names), HP-4032, EXA-4750, EXA-4700 (manufactured by DIC Corporation, trade names), and the like of naphthalene group-containing epoxy resins; HP-7200, HP-7200H (manufactured by DIC Corporation, trade names) and the like of epoxy resins having a dicyclopentadiene skeleton; CP-50S, CP-50M (manufactured by NOF CORPORATION, trade names) and the like of glycidyl methacrylate copolymer-based epoxy resins; PB-3600, PB-4700 (manufactured by Daicel Corporation, trade names) of epoxy-modified polybutadiene rubber derivatives; and YR-102, YR-450 (NIPPON STEEL & SUMIKIN CHEMICAL CO., LTD., trade names) and the like of CTBN-modified epoxy resins. However, the examples are not limited to these. These epoxy resins can be used singly or in combination of two or more kinds thereof.

Regarding the (e) inorganic filler material, for example, barium sulfate, barium titanate, powdered silicon oxide, amorphous silica, talc, clay, calcined kaolin, magnesium carbonate, calcium carbonate, aluminum oxide, aluminum hydroxide, mica powder, and the like can be used. Among those described above, barium sulfate or silica filler may also be incorporated.

The average particle size of the (e) inorganic filler material may be 1 µm or less, may be 30 nm to 800 nm, or may be 50 nm to 600 nm. Furthermore, the maximum particle size of the (e) inorganic filler material may be 10 µm or less, or may be 5 µm or less. The average particle size and the maximum particle size of the inorganic filler material can be measured according to, for example, a laser diffraction method or a dynamic scattering method, in a state of being dispersed in the photosensitive resin composition.

The content of the (e) inorganic filler material may be 10% to 90% by mass, may be 20% to 80% by mass, or may be 30% to 70% by mass, based on the total amount of the photosensitive resin composition.

The photosensitive resin composition of the present embodiment includes a pigment component as necessary. For example, colorants such as Phthalocyanine Blue, Phthalocyanine Green, Iodine Green, Disazo Yellow, Malachite Green, Crystal Violet, titanium oxide, carbon black, Naphthalene Black, azo-based organic pigments; and dyes can be used.

The photosensitive resin composition of the present embodiment may further include polymerization inhibitors such as hydroquinone, hydroquinone monomethyl ether, tert-butylcatechol, pyrogallol, phenothiazine, and nitroso compounds; thixotropy imparting agents such as bentone, montmorillonite, Aerosil, and amide wax; silicone-based, fluorine-based, polymer-based defoaming agents; leveling agents; adhesiveness enhancers such as melamine; curing accelerators such as dicyandiamide, and the like, to the extent that the desired characteristics of the photosensitive resin composition are not affected.

It is desirable that the photosensitive resin composition of the present embodiment includes a solvent as necessary. Furthermore, the photosensitive resin composition of the present embodiment may also include an elastomer component as necessary. Regarding the solvent, for example, general solvents such as methanol, ethanol, acetone, methyl ethyl ketone, propylene glycol monoacetate, ethylene glycol dimethyl ether, toluene, and petroleum naphtha can be used singly or in combination of two or more kinds thereof.

Meanwhile, the content of the solvent may be 5% to 60% by mass of the total weight, in a case in which the photosensitive resin composition is used in a liquid state.

Regarding the protective film, for example, polymer films of polyethylene terephthalate, polypropylene, polyethylene, polyesters, and the like, which have heat resistance and solvent resistance, can be used. Examples of commercially available films include product name: "ALPHAN MA-410", "E-200C" manufactured by Oji Paper Co., Ltd.; polypropylene films manufactured by Shin-Etsu Film Co., Ltd., and the like; polyethylene terephthalate films of PS series, such as product name: "PS-25", manufactured by TEIJIN LIMITED; however, the examples are not limited to these. The thickness of the protective film may be 1 to 100 µm, may be 5 to 50 µm, may be 5 to 30 µm, or may be 15 to 30 µm. When this thickness is greater than or equal to 1 µm, there is a tendency that the protective film is not easily broken at the time of lamination, and when the thickness is 100 µm or less, the low price characteristics tend to be excellent. Meanwhile, the protective film may be such that the adhesive force between the photosensitive layer and the protective film is smaller than the adhesive force between the photosensitive layer and the support film, or the protective film may be a film with fewer fisheyes. Fisheyes are foreign materials, undissolved materials, oxidative deterioration products and the like of the material have been incorporated into the film when a film is produced through heat melting, kneading, extruding, biaxial stretching, casting and the like of the material.

The photosensitive layer may also be formed by dissolving the photosensitive resin composition described above in a solvent such as described above to obtain a solution (coating liquid) having a solid content of about 30% to 70% by mass, subsequently applying such a solution (coating liquid) on a support film, and drying the solution. The application can be carried out by, for example, known methods using a roll coater, a comma coater, a gravure coater, an air knife coater, a die coater, a bar coater, and the like. Furthermore, the drying can be carried out at 70° C. to 150° C. for 5 to 30 minutes. The amount of residual organic solvent in the photosensitive resin composition may be adjusted to 3% by mass or less relative to the total amount of the photosensitive resin composition, from the viewpoint of preventing diffusion of the organic solvent in the subsequent processes. The thickness of the photosensitive layer may vary depending on the applications; however, the thickness may be, as a thickness after drying, 10 to 100 µm, may be 15 to 60 μm, or may be 20 to 50 μm. When this thickness is 10 μm or more, coating tends to be facilitated in an industrial scale, and when the thickness is 100 μm or less, sensitivity and resolution inside the photosensitive layer tend to increase.

Next, the method for forming a resist pattern (permanent mask resist) using the photosensitive film of the present embodiment will be explained.

First, on a substrate on which a resist pattern should be formed, a photosensitive layer is formed using the photosensitive element described above. Specifically, the protective film of the photosensitive film described above is peeled off from the photosensitive layer, and the exposed surface is adhered by lamination or the like, so as to cover the conductor layer having a circuit pattern, which has been formed on the substrate. From the viewpoint of enhancing adhesiveness and shape conformity, a photosensitive layer may also be formed by a method of laminating under reduced pressure.

Next, a removal step of removing the support film from the photosensitive film is carried out as necessary, and an exposure step of irradiating a predetermined part of the photosensitive layer with active light rays, and photocuring the photosensitive layer in the irradiated part, is carried out. The photosensitive film of the present embodiment can be applied particularly preferably to an embodiment of removing the support film before exposure. Furthermore, regarding the method of irradiating a predetermined part of the photosensitive layer with active light rays, any conventionally known method can be applied; however, a system which does not use a mask, such as direct drawing system or a projection exposure system, or an exposure system of disposing a negative mask so as not to be directly brought into contact with the photosensitive layer can be suitably applied.

Furthermore, in a case in which a support film is present on the photosensitive layer, a resist pattern can be formed by removing the support film, subsequently removing the part that has not been photocured (unexposed part) by wet developing or dry developing, and then performing developing.

In the case of wet developing as described above, regarding the developer liquid, a material that is safe, stable and satisfactorily operable, such as an alkaline aqueous solution or an organic solvent developer liquid, is used in accordance with the kind of the photosensitive resin composition. Furthermore, regarding the developing method, known methods such as spraying, swinging immersion, brushing, and scraping are appropriately employed.

Regarding the base of the alkaline aqueous solution, bases that are safe and stable and have satisfactory operability, such as lithium hydroxide, sodium hydroxide, potassium hydroxide and the like, which are hydroxides of alkali metals, for example, lithium, sodium, and potassium; alkali carbonates or alkali bicarbonates, which are carbonates or bicarbonates of alkali metals, ammonium and the like; sodium phosphate, potassium phosphate and the like, which are phosphates of alkali metals; sodium pyrophosphate, potassium pyrophosphate and the like, which are pyrophosphates of alkali metals; borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2, and morpholine, are used.

Furthermore, regarding such an alkaline aqueous solution, for example, a dilute solution of 0.1% to 5% by mass of sodium carbonate, a dilute solution of 0.1% to 5% by mass of potassium carbonate, a dilute solution of 0.1% to 5% by mass of sodium hydroxide, or a dilute solution of 0.1% to 5% by mass of sodium tetraborate can be used, and the pH of the alkaline aqueous solution may be in the range of 9 to 11. Furthermore, the temperature of such an alkaline aqueous solution is regulated according to developability of the photosensitive layer, and may be adjusted to 20° C. to 50° C. In the alkaline aqueous solution, small amounts of organic solvents such as a surfactant and a defoaming agent may be incorporated in order to accelerate developing.

Regarding the organic solvent used for the organic solvent developer liquid, for example, acetone, ethyl acetate, an alkoxyethanol having an alkoxy group having 1 to 4 carbon atoms, ethyl alcohol, isopropyl alcohol, butyl alcohol, diethylene glycol monomethyl ether, diethylene glycol monoethyl ether, and diethylene glycol monobutyl ether are used. The concentration of such an organic solvent may be usually 2% to 90% by mass. Furthermore, the temperature of such an organic solvent can be regulated in accordance with developability. Such organic solvents can be used singly or in combination of two or more kinds thereof. Examples of the organic solvent developer liquid to be used singly include 1,1,1-trichloroethane, N-methylpyrrolidone, N,N-dimethylformamide, cyclohexanone, methyl isobutyl ketone, and γ-butyrolactone.

In regard to the method for forming a resist pattern of the present embodiment, if necessary, two or more kinds of the developing methods described above may be used in combination. Examples of the developing system include a dipping system, a battle system, a spray system, a high pressure spray system, brushing, and slapping, and a high pressure spray system is most suitable for the enhancement of resolution. For the etching of a metal surface that is carried out after developing, for example, a cupric chloride solution, a ferric chloride solution, or an alkali etching solution can be used.

Next, a suitable embodiment of a permanent mask resist using the photosensitive film of the present embodiment will be explained.

After completion of the developing step, ultraviolet irradiation using a high pressure mercury lamp, or heating may be carried out for the purpose of increasing solder heat resistance, chemical resistance, and the like. In the case of irradiating with ultraviolet radiation, the dose can be adjusted as necessary, and for example, irradiation can be carried out at a dose of about 0.05 to 10 J/cm$^2$. Furthermore, in the case of heating the resist pattern, heating may be carried out at a temperature range of about 130° C. to 200° C. for about 15 to 90 minutes.

Ultraviolet irradiation and heating may be both carried out. In this case, both may be carried out simultaneously, or any one of them may be carried out, and then the other may be carried out. In the case of performing ultraviolet irradiation and heating simultaneously, heating may be performed at 60° C. to 150° C., from the viewpoint of imparting solder heat resistance and chemical resistance more satisfactorily.

The surface roughness Ra of the permanent mask resist (cured film) according to the present embodiment may be 200 to 4,000 nm, may be 250 to 3,000 nm, or may be 300 to 2,000 nm. Furthermore, the surface roughness Ra of the permanent mask resist (cured film) according to the present embodiment may be larger than 500 nm and 4,000 nm or less.

The permanent mask resist formed as such also functions as a protective film for the wiring after the substrate has been subjected to soldering, and has general characteristics of solder resist. Thus, the permanent mask resist can be used as solder resist for printed wiring boards, solder resist for semiconductor package substrates, or solder resist for flexible wiring boards.

The solder resist is used as, for example, plating resist or etching resist in a case in which a substrate is subjected to plating or etching, and is also used as a protective film for protecting wiring or the like by being remained on the substrate as it is (permanent mask resist).

Furthermore, in the exposure step described above, in a case in which exposure is performed using a mask having a pattern in which a predetermined part of the conductor layer is unexposed, or drawing data, the unexposed part is removed by developing this, and thus a resist having an opening pattern in which a portion of the conductor layer formed on the substrate is exposed is obtained. Subsequently, the resist may be subjected to treatments that are necessary for forming the permanent mask resist described above.

A semiconductor package can also be produced by forming other members, for example, a sealant material, an underfill and copper, on a substrate on which the permanent mask resist described above has been formed.

For example, a copper pattern may be formed by forming a copper layer on the above-mentioned permanent mask resist by sputtering, plating or the like, and subjecting this to an etching treatment, that is, rewiring may be achieved by a build-up process. When the permanent mask resist of the present embodiment is used, a copper pattern having excellent adhesiveness can be formed.

Furthermore, in a case in which the photosensitive element of the present embodiment is applied as a photosensitive solder resist, a semiconductor chip is connected onto a semiconductor package substrate by flip-chip interconnection, and then a sealant material or an underfill is formed on the solder resist; however, satisfactory adhesiveness can be obtained in both cases by the effects described above.

[Semiconductor Package]

The photosensitive element of the present embodiment can be suitably used for the formation of a permanent mask resist (permanent resist layer) of a printed wiring board for semiconductor packaging. FIG. 1 is a schematic cross-sectional view illustrating an embodiment of a semiconductor package. A semiconductor package 10 includes a substrate for semiconductor chip mounting 50, and a semiconductor chip 120 mounted on the substrate for semiconductor chip mounting 50. The substrate for semiconductor chip mounting 50 and the semiconductor chip 120 are bonded by an adhesive 117 formed from a die bonding film or a die bonding paste. The substrate for semiconductor chip mounting 50 includes an insulating substrate 100, and on one surface of the insulating substrate 100, a wiring terminal for wire bonding 110 and a permanent resist layer 90 having openings formed therein, through which a portion of the wiring terminal 110 is exposed, are provided. On the reverse surface, a permanent resist layer 90 and a connection terminal for solder interconnection 111 are provided. The permanent resist layer 90 is a layer containing a cured product formed using the photosensitive film of the present embodiment. The connection terminal for solder interconnection 111 has solder balls 114 mounted thereon, in order to perform electrical connection to the printed wiring board. The semiconductor chip 120 and the wiring terminal for wire bonding 110 are electrically connected using metal wires 115. The semiconductor chip 120 is sealed by a semiconductor sealing resin 116. When the semiconductor package is formed using the photosensitive film, permanent mask resist or a method for producing the same, or the method for producing a semiconductor package of the present embodiment, adhesiveness to different kinds of materials (that is, semiconductor sealing resin 116) is enhanced. Furthermore, the "surface on the opposite side of the substrate" of the cured product with regard to the surface on the opposite side of the substrate means the surface that is brought into contact with different kinds of materials. Meanwhile, the photosensitive element of the present embodiment can also be applied to flip-chip type semiconductor packages.

Figure 2:
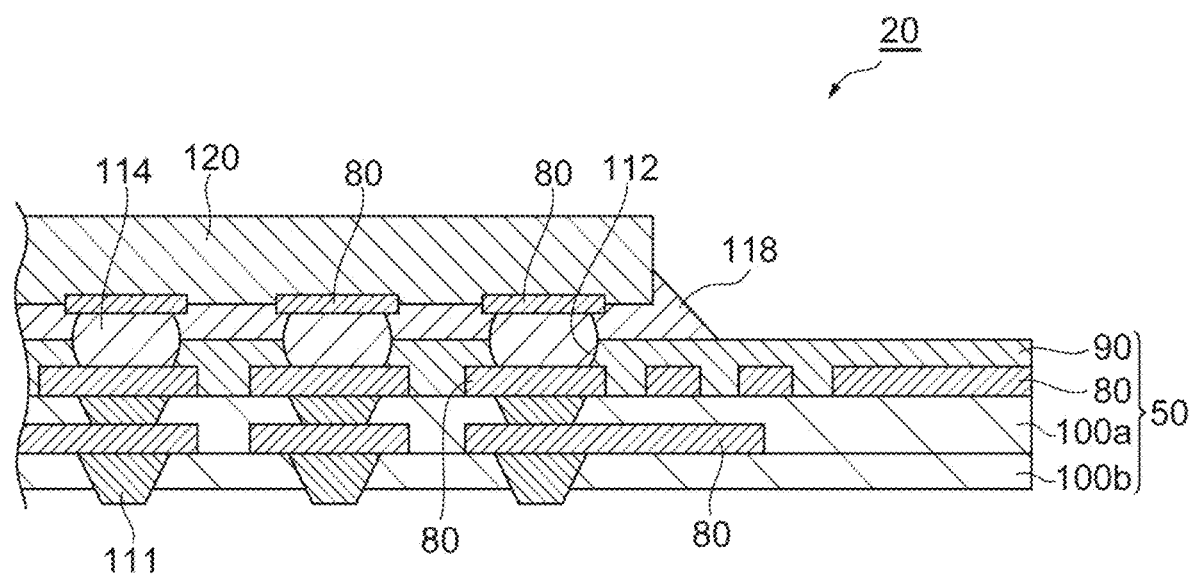
FIG. 2 is a schematic cross-sectional view of a flip-chip type package substrate.

FIG. 2 is a schematic cross-sectional view illustrating a flip-chip type semiconductor package substrate. A flip-chip type semiconductor package substrate 20 includes a substrate for semiconductor chip mounting 50, and a semiconductor chip 120 mounted on the substrate for semiconductor chip mounting 50. Between the substrate for semiconductor chip mounting 50 and the semiconductor chip 120, an underfill agent 118 is filled. The substrate for semiconductor chip mounting 50 has a configuration in which an insulating substrate 100$b$, an insulating substrate 100$a$, and a permanent resist layer 90 are laminated in this order. The permanent resist layer 90 is a layer containing a cured product formed using the photosensitive film of the present embodiment described above. The insulating substrate 100$b$ has a patterned copper wiring 80 on the surface of the side of the insulating substrate 100$a$, and the insulating substrate 100$a$ has a patterned copper wiring 80 on the side of the permanent resist layer 90. At least portions of the copper wiring 80 on the insulating substrate 100$b$ and the copper wiring 80 on the insulating substrate 100$a$ are electrically connected by a connection terminal for solder interconnection 111 that is formed so as to penetrate through the insulating substrate 100$a$ and the insulating substrate 100$b$. Furthermore, the permanent resist layer 90 is formed so as to cover the copper wiring 80 on the insulating substrate 100$a$; however, on the copper wiring 80 corresponding to the connection terminal for solder interconnection 111, openings 112 are formed such that the copper wiring 80 is exposed. The copper wiring 80 on the insulating substrate 100$a$ is electrically connected to the copper wiring 80 formed on the surface that faces the substrate for semiconductor chip mounting 50 of the semiconductor chip 120, through solder balls 114 provided at the openings 112. When the semiconductor package is formed using the photosensitive film, the permanent mask resist or a method for producing the same, or the method or producing a semiconductor package of the present embodiment, adhesiveness to different kinds of materials (that is, underfill agent 118) is enhanced.

A substrate including the permanent mask resist of the present embodiment is subsequently subjected to mounting of semiconductor elements and the like (for example, wire bonding and C4 solder interconnection), and the substrate is mounted in electronic apparatuses such as personal computers.

Furthermore, a cured product formed using the photosensitive film of the present embodiment can be suitably used as an interlayer insulating film. When the photosensitive film is used as an interlayer insulating film, adhesiveness to other materials can be enhanced.

EXAMPLES

Hereinafter, the present disclosure will be described in more detail by way of Examples; however, the present disclosure is not intended to be limited to these Examples.

First, components described below were mixed in the amounts of incorporation (parts by weight) indicated in Table 1, and solutions of photosensitive resins A to F were obtained.

(Photosensitive Resin A)

As a photosensitive prepolymer having at least one ethylenically unsaturated group and a carboxyl group in the molecule, acid-modified cresol-novolac type epoxy acrylate "EXP-2810" (manufactured by DIC Corporation, trade name) was used. The weight average molecular weight was 10,000, and the acid value was 70 mg KOH/g.

As a photoreactive compound, a dipentaerythritol pentaacrylate and dipentaerythritol hexaacrylate mixture "KAYARAD DPHA" (manufactured by Nippon Kayaku Co., Ltd., trade name) was used.

Furthermore, as photopolymerization initiators, 2,4,6-trimethylbenzoyl-diphenylphosphine oxide "DAROCURE-TPO" (manufactured by BASF SE, trade name) and 2,4-diethylthioxanthone "KAYACURE DETX-S" (manufactured by Nippon Kayaku Co., Ltd., trade name) were used.

As epoxy resins, biphenyl aralkyl type epoxy resin "NC-3000H" (manufactured by Nippon Kayaku Co., Ltd., trade name) and bisphenol F type epoxy resin "YSLV-80" (manufactured by NIPPON STEEL & SUMIKIN CHEMICAL CO., LTD., trade name) were used.

As inorganic filler materials, barium sulfate "B30" (manufactured by Sakai Chemical Industry Co., Ltd., trade name) and silica "MEK slurry (1)" (manufactured by Admatechs Co., Ltd., sample name) were used. The average particle size and the maximum particle size of an inorganic filler material in the state of being dispersed in the photosensitive resin composition were measured using a laser diffraction scattering type MicroTrac particle size distribution analyzer, "MT-3100" (manufactured by Nikkiso Co., Ltd.). The average particle size of B30 was 0.3 μm, and the average particle size of MEK slurry (1) was 0.5 μm. Furthermore, the maximum particle size of the inorganic filler materials including B30 and MEK slurry was 3 μm or less.

Furthermore, the particle size of an inorganic filler material after film formation was checked by observing a cross-section with an electron microscope (SEM) after curing the film. It was confirmed that the maximum particle size of the inorganic filler material dispersed in the film was 5 μm or less.

Regarding other components, the following materials were used. "EPOLEAD PB3600" (manufactured by Daicel Corporation, trade name) as a butadiene-based elastomer, "ANTAGE 500" (manufactured by Kawaguchi Chemical Industry Co., Ltd., trade name) as a polymerization inhibitor, a curing accelerator, melamine and dicyandiamide as adhesiveness enhancers, and Phthalocyanine Blue was used as a pigment. For the solvent, methyl ethyl ketone and propylene glycol monomethyl ether acetate were used.

(Photosensitive Resin B)

Photosensitive resin B was obtained by blending the components in the same manner as in the case of photosensitive resin A, except that "IRGACURE 907" (2-methyl-1-(4-(methylthio)phenyl)-2-morpholinopropan-1-one) (manufactured by BASF SE, trade name) was used as a photopolymerization initiator, instead of "DAROCURE-TPO" (manufactured by BASF SE, trade name).

(Photosensitive Resin C)

As an inorganic filler material, "Sample 2-N" (manufactured by Admatechs Co., Ltd., sample name, slurry in which nanosilica that has been surface-treated with a silane compound was dispersed in methyl ethyl ketone) was used. The dispersed state of the surface-treated silica in Sample 2-N was analyzed using a dynamic light scattering type Nano-Trac particle size distribution analyzer, "UPA-EX150" (manufactured by Nikkiso Co., Ltd.), and it was confirmed that the average particle size was 0.05 μm, while the maximum particle size was 1 μm or less. Except for these, the same components were blended in the same manner as in the case of photosensitive resin A, and thereby photosensitive resin C was obtained.

(Photosensitive Resin D)

Photosensitive resin D was obtained by blending the components in the same manner as in the case of photosensitive resin A, except that no inorganic filler material was incorporated.

(Photosensitive Resin E)

Photosensitive resin E was obtained by blending the components in the same manner as in the case of photosensitive resin A, except that "FA-321M" (manufactured by Hitachi Chemical Company, Ltd., trade name) was used as a photoreactive compound, instead of "KAYARAD DPHA" (manufactured by Nippon Kayaku Co., Ltd., trade name).

(Photosensitive Resin F)

Photosensitive resin F was obtained by blending the components in the same manner as in the case of photosensitive resin A, except that UXE-3024 (manufactured by Nippon Kayaku Co., Ltd., trade name) was used as a photosensitive prepolymer having at least one ethylenically unsaturated group and a carboxyl group in the molecule, instead of "EXP-2810" (manufactured by DIC Corporation, trade name).

TABLE 1

| Photosensitive resin composition | A | B | C | D | E | F |
|---|---|---|---|---|---|---|
| Developer liquid-soluble resin | | | | | | |
| EXP-2810PM | 85 | 85 | 85 | 85 | 85 | — |
| UXE-3024 | — | — | — | — | — | 85 |
| Photoreactive compound | | | | | | |
| DPHA | 15 | 15 | 15 | 15 | — | 15 |
| FA-321M | — | — | — | — | 15 | — |
| Photopolymerization initiator | | | | | | |
| DAROCURE TPO | 3.0 | — | 3.0 | 3.0 | 3.0 | 3.0 |
| IRGACURE 907 | — | 3.0 | — | — | — | — |
| DETX-S | 0.3 | 0.3 | 0.3 | 0.3 | 0.3 | 0.3 |
| Polyfunctional epoxy resin | | | | | | |
| NC-3000H | 10 | 10 | 10 | 10 | 10 | 10 |
| YSLV-80 | 20 | 20 | 20 | 20 | 20 | 20 |
| Inorganic filler material | | | | | | |
| B30 | 30 | 30 | — | — | 30 | 30 |
| MEK slurry ① | 50 | 50 | — | — | 50 | 50 |
| Sample 2-N | — | — | 200 | — | — | — |
| Additives | | | | | | |
| PB3600 | 3.0 | 3.0 | 3.0 | 3.0 | 3.0 | 3.0 |
| ANTAGE 500 | 0.5 | 0.5 | 0.5 | 0.5 | 0.5 | 0.5 |
| Melamine | 2.0 | 2.0 | 2.0 | 2.0 | 2.0 | 2.0 |
| Dicyandiamide | 1.0 | 1.0 | 1.0 | 1.0 | 1.0 | 1.0 |
| Pigment | 1.2 | 1.2 | 1.2 | 1.2 | 1.2 | 1.2 |

Examples 1 to 12 and Comparative Examples 1 to 3

The solutions of photosensitive resins A to F described above were uniformly applied on the following support films having different surface roughness values at the surfaces that were in contact with the photosensitive layer, and thus photosensitive layers were formed.

Support film A: PET X42-26 (kneaded mat type) manufactured by TORAY INDUSTRIES, INC.

Film thickness: 26 μm, surface roughness Ra: 370 nm, haze: 80%

Support film B: PET X44-26 (kneaded mat type) manufactured by TORAY INDUSTRIES, INC.

Film thickness: 26 μm, surface roughness Ra: 265 nm, haze: 77%

Support film C: PET type A processed (sandblast processed) manufactured by Kaisei Industry Co., Ltd.

Film thickness: 50 μm, surface roughness Ra: 572 nm, haze: 72%

Support film D: PE T-5N (emboss processed type) manufactured by Okura Industrial Co., Ltd.

Film thickness: 34 μm, surface roughness Ra: 3500 nm, haze: 88%

Support film E: OPP MA-420 manufactured by Oji F-Tex Co., Ltd.

Film thickness: 35 μm, surface roughness Ra: 100 nm, haze: 7.5%

Support film F: PET HPE (highly transparent type) manufactured by Teijin DuPont Films, Japan Limited.

Film thickness: 25 μm, surface roughness Ra: <50 nm, haze: 0.9%

Support film G: PET type B processed (sandblast processed) manufactured by Kaisei Industry Co., Ltd.

Film thickness: 50 μm, surface roughness Ra: 1022 nm, haze: 76%

Support film H: PET type C processed (sandblast processed) manufactured by Kaisei Industry Co., Ltd.

Film thickness: 50 μm, surface roughness Ra: 2339 nm, haze: 84%

Support Film I: PE prototype (emboss processed) manufactured by Okura Industrial Co., Ltd.

Film thickness: 34 μm, surface roughness Ra: 4875 nm, haze: 92%

After a photosensitive layer was formed, the photosensitive layer was dried for about 10 minutes at 100° C. using a hot air convection type dryer. The film thickness after drying of the photosensitive layer was 25 μm. Subsequently, an OPP biaxially stretched polypropylene film (MA-411, manufactured by Oji F-Tex Co., Ltd., trade name) was bonded, as a protective film, onto the surface of the photosensitive layer on the opposite side of the side that was in contact with the support film, and thus a photosensitive film was obtained.

Combinations of the photosensitive resins and the support films used in Examples 1 to 7 and Comparative Examples 1 and 2 are presented in Table 2. Meanwhile, Example 8 is an example which employed a combination of the same photosensitive resin and the same support film as that of Example 1; however, during the production of the evaluation substrate, the support film was peeled off after exposure, as in the case of a method for using a general photosensitive film without peeling off the support film before exposure. Furthermore, the combinations of the photosensitive resin and the support film used in Examples 9 to 12 and Comparative Example 3 are presented in Table 3.

[Evaluation of Sensitivity and Resolution]

The copper surface of a substrate for printed wiring board (MCL-E-679, manufactured by Hitachi Chemical Company, Ltd., trade name), which had a copper foil having a thickness of 12 μm laminated on a glass epoxy substrate, was treated with a roughening pretreatment liquid CZ-8100 (manufactured by MEC COMPANY LTD.), and the copper surface was washed with water and then dried. A photosensitive film was laminated, after having the protective film peeled off therefrom, on this substrate for printed wiring board using a press type vacuum laminator (MVLP-500, manufactured by MEIKI CO., LTD., trade name) under the conditions of a press heat plate temperature of 70° C., an evacuation time of 20 seconds, a laminate pressing time of 30 seconds, an air pressure of 4 kPa or less, and a pressing pressure of 0.4 MPa. Thus, a laminate for evaluation was obtained.

Figure 3:
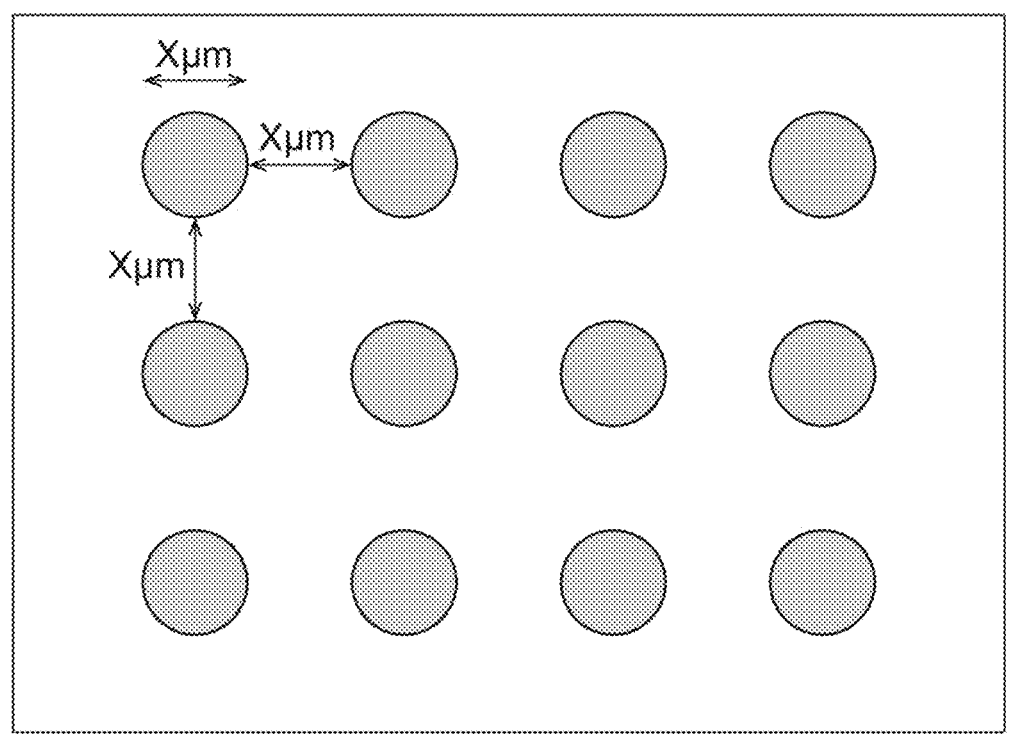
FIG. 3 is an outline perspective view of an exposure pattern that is used for evaluations of sensitivity and resolution.

Subsequently, after the laminate was left to stand for 1 hour or longer at room temperature, the support film was peeled off and removed, a 41-stage step tablet was installed, and exposure was performed using a direct imaging exposure apparatus, DXP-3512 (manufactured by ORC MANUFACTURING CO., LTD.), equipped with an ultrahigh pressure mercury lamp as a light source. Regarding the exposure pattern, a pattern having dots having a diameter varying from 30 μm to 100 μm at a pitch of 10 μm was used. The exposure pattern has blocks in which dots having a predetermined diameter shown in FIG. 3 (X μm in the diagram) are arranged in a lattice shape, at a distance equivalent to each diameter (diameter of a pitch of 10 μm from 30 μm to 100 μm).

After the laminate was left to stand at room temperature for 30 minutes from after the exposure, the photosensitive resin composition at unexposed parts was spray-developed for 60 seconds with a 1 mass % aqueous solution of sodium carbonate at 30° C. After developing, the amount of exposure energy with which the number of gloss remaining step stages of the 41-stage step tablet became 10.0 was designated as the sensitivity (unit: mJ/cm$^2$) of the photosensitive layer. An evaluation of the photosensitive layer was performed using the pattern exposed at this sensitivity.

In the evaluation of sensitivity, a sample in which the amount of exposure energy with which the number of step stages became 10.0, was 200 mJ/cm$^2$ or less was rated as "A"; a sample in which the amount of exposure energy was more than 200 mJ/cm$^2$ and 300 mJ/cm$^2$ or less was rated as "B"; and a sample in which the amount of exposure energy was more than 300 mJ/cm$^2$ was rated as "C". Meanwhile, as the amount of exposure energy is smaller, the time required for exposure at high sensitivity becomes shorter, and particularly the throughput for direct imaging exposure is improved.

Furthermore, regarding the evaluation of resolution, exposure was performed at an amount of exposure energy with which the number of step stages became 10.0, spray developing was performed, and the resist pattern was observed after the developing treatment using an optical microscope for evaluation. The smallest pore diameter (m) that was open without any residual substance in the dot pattern was designated as the minimum resolution. The results are presented in Tables 2 and 3.

[Evaluation of Support Film Peelability]

A photosensitive film was laminated on a substrate under the conditions described for the evaluation of sensitivity and resolution, and then the laminate was left to stand for 1 hour or longer at room temperature. Subsequently, when the support film was peeled off and removed without performing exposure, a sample in which the photosensitive layer was stuck to the support film side and was peeled off from the substrate was rated as "C"; a sample in which the photosensitive layer was partially peeled off from the substrate was rated as "B"; and a sample in which the photosensitive layer was not peeled off from the substrate was rated as "A". The results are presented in Tables 2 and 3.

[Evaluation of CTE]

A cured product of the photosensitive resin composition was formed on a polyethylene terephthalate film having a thickness of 16 μm (G2-16, manufactured by TEIJIN LIMITED, trade name) (support film), by exposing the entire surface of the laminate for evaluation, and performing developing, ultraviolet irradiation, and heating treatment. Subsequently, the laminate was cut into a size of 3 mm in width and 30 mm in length with a cutter knife, and then the polyethylene terephthalate on the cured product was peeled off. Thus, a permanent mask resist for an evaluation of the coefficient of thermal expansion was obtained.

Measurement of the coefficient of thermal expansion in a tensile mode was performed using a TMA apparatus, SS6000 (manufactured by Seiko Instruments, Inc.). The tensile load was 2 g, the span (distance between chucks) was 15 mm, and the rate of temperature increase was 10° C./min. First, the sample was mounted on the apparatus, was heated from room temperature (25° C.) to 160° C., and was left to stand for 15 minutes. Subsequently, the sample was cooled to −60° C., and measurement was performed from −60° C. to 250° C. under the conditions of a rate of temperature increase of 10° C./min. A deflection point observed in the range of from 25° C. to 200° C. was designated as Tg. The CTE was obtained using the gradient of a tangent line of the curve obtained at a temperature equal to or lower than Tg. A sample having a value of CTE of 30 ppm/° C. or less was rated as "3"; a sample having a value of CTE of more than 30 ppm and 60 ppm or less was rated as "2"; and a sample having a value of CTE of more than 60 ppm was rated as "1". The results are presented in Tables 2 and 3.

[Evaluation of Adhesiveness of Sealant Material, Underfill, and Copper Wiring]

The laminate for evaluation described for the evaluation of sensitivity and resolution was irradiated with ultraviolet radiation at an amount of energy of 1 J/cm$^2$ using an ultraviolet irradiation apparatus manufactured by Orc Manufacturing Co., Ltd., and a heating treatment was performed at 160° C. for 60 minutes. Thereby, a substrate for evaluation having a photosensitive insulating film formed on the surface was obtained.

On the photosensitive insulating film of this substrate, sealant CEL-C-9700 series (manufactured by Hitachi Chemical Company, Ltd., trade name) was formed into cylindrical pillar shapes, and thus a test sample for evaluating sealant material adhesiveness was obtained.

Furthermore, on the photosensitive insulating film of this substrate, underfill CEL-C-3730S (manufactured by Hitachi Chemical Company, Ltd., trade name) was formed into cylindrical pillar shapes, and thus a test sample for evaluating underfill adhesiveness evaluation was obtained.

Furthermore, copper sputtering was performed on this substrate, and underfill CEL-C-3730S (manufactured by Hitachi Chemical Company, Ltd., trade name) was further formed into cylindrical pillar shapes thereon. Thus, a test sample for evaluating sputter copper adhesiveness was obtained.

Figure 4:
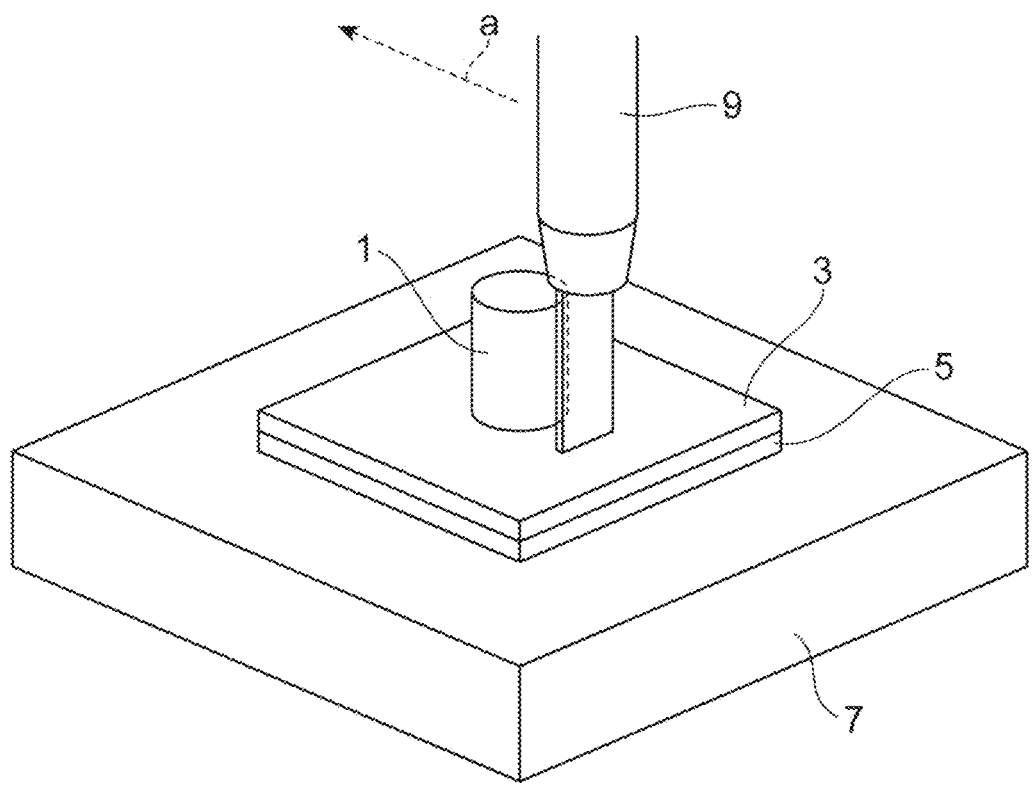
FIG. 4 is a schematic perspective view illustrating a method for evaluating adhesiveness using a die bonding tester.

Regarding adhesiveness, the adhesive strength of each of the test samples was measured at room temperature, at a height of measurement of 50 μm and a measurement speed of 50 μm/sec using a die bonding tester (manufactured by Rhesca Corp.). The method for evaluating adhesiveness with a die bonding tester is illustrated in FIG. 4. In FIG. 4, reference numeral 1 represents the sealing material or underfill (hereinafter, referred to as "adhesive body 1") formed into pillar shapes; reference numeral 3 represents a photosensitive insulating film; and reference numeral 5 represents a substrate. The substrate is fixed onto a support 7 of the die bonding tester, and the adhesive body is pressed toward the direction a using a tool 9. Thereby, the test sample is destroyed.

In regard to the evaluation of adhesiveness of the sealant material and the underfill, when the test sample was destroyed with a die bonding tester, a sample that was destroyed at the interface between copper and the photosensitive insulating film 3, or was destroyed by cohesive fracture of the substrate 5, was rated as "A"; a sample that was destroyed at the interface between the adhesive body 1 and the photosensitive insulating film 3 was rated as "C"; and a sample that was destroyed at both interfaces was rated as "B".

In regard to the sputter copper adhesiveness, a sample having a peel strength value of 1 MPa or more was rated as "A"; a sample having a peel strength value of 0.5 or more and less than 1 MPa was rated as "B"; and a sample having a peel strength value of less than 0.5 MPa was rated as "C". The results are presented in Tables 2 and 3.

[Evaluation of HAST Resistance]

An interdigitated array electrode having a line/space ratio of 8 μm/8 μm was produced using a substrate for printed wiring board (MCL-E-679FQ Hitachi Chemical Company, Ltd., trade name), in which a copper foil having a thickness of 12 μm was laminated on a glass epoxy substrate, as a core material and a buildup material for forming semi-additive wiring (AS-ZII, manufactured by Hitachi Chemical Company, Ltd., trade name). This was used as an evaluation substrate.

On the interdigitated array electrode in this evaluation substrate, a photosensitive insulating film formed from a cured product of the resist was formed in the same manner as in the cases of the "Evaluation of sensitivity and resolution" and "Adhesiveness" described above (the photosensitive insulating film was formed by exposing the insulating film such that solder resist remained in the interdigitated array electrode part, and subjecting the insulating film to developing, ultraviolet irradiation, and a heating treatment). Subsequently, the photosensitive insulating film was exposed for 200 hours under the conditions of 130° C., 85% RH, and 6 V. Subsequently, the resistance value was measured, and the degree of occurrence of migration was observed using a metal microscope at a magnification of 100 times. Thus, these were evaluated by the following criteria. That is, a sample in which the resistance value was retained at $1.0 \times 10^{10} \Omega$ or higher, and migration did not occur in the photosensitive insulating film, was rated as "A"; a sample in which the resistance value was retained at $1.0 \times 10^{10} \Omega$ or higher, but migration slightly occurred, was rated as "B"; and a sample in which the resistance value was less than $1.0 \times 10^{10} \Omega$, and migration occurred extensively, was rated as "C". The results are presented in Tables 2 and 3.

[Evaluation of Crack Resistance]

Similarly to the "Production of evaluation substrate" described above, a thermal cycle in which the laminate for evaluation having a photosensitive insulating film formed thereon was exposed to the atmosphere at −65° C. for 15 minutes, subsequently the temperature was increased at a rate of temperature increase of 180° C./min, subsequently the laminate was exposed to the atmosphere at 150° C. for 15 minutes, and then the temperature was decreased at a rate of temperature decrease of 180° C./min, was repeated 1,000 times. After the exposure in such an environment, the degree of cracking and peeling of the permanent mask resist of the laminate for evaluation was observed with a metal microscope at a magnification of 100 times, and the laminate for evaluation was evaluated by the following criteria. That is, 10 sites of an opening which measured 2 mm on each side were checked, and a sample in which no cracks and peeling of the permanent mask resist were observed was rated as "A"; a sample in which cracks and peeling were observed at two or fewer sites among the 10 sites was rated as "B"; and a sample in which cracks and peeling were observed at three or more sites among the 10 sites was rated as "C". The results are presented in Tables 2 and 3.

[Evaluation of Surface Roughness of Cured Product]

The surface roughness Ra of a cured product obtained by the method described above was measured using a microscope (manufactured by Keyence Corp., trade name: "LASER SCAN MICROSCOPE VK-8500") under the conditions of a measurement range of 100 μm×100 μm.

REFERENCE SIGNS LIST

1 ADHESIVE BODY
3 PHOTOSENSITIVE INSULATING FILM
5 SUBSTRATE
7 SUPPORT
9 TOOL
10 SEMICONDUCTOR PACKAGE
20 SEMICONDUCTOR PACKAGE SUBSTRATE
50 SUBSTRATE FOR SEMICONDUCTOR CHIP MOUNTING
80 COPPER WIRING
90 PERMANENT RESIST LAYER
100, 100a, 100b INSULATING SUBSTRATE
110 WIRING TERMINAL FOR WIRING BONDING

TABLE 2

| Item | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| Photosensitive resin | A | B | C | D | A | A | A | A | A | A |
| Support film | A | A | A | A | B | C | D | A | E | F |
| Protective film | A | A | A | A | A | A | A | A | A | A |
| Ra [nm] | 370 | 370 | 370 | 370 | 265 | 572 | 3500 | 370 | 100 | <50 |
| Sensitivity | A | B | A | A | A | A | A | C | A | A |
| Resolution | 50 | 50 | 50 | 30 | 50 | 50 | 50 | 100 | 50 | 50 |
| Support film peelability | A | A | A | A | A | A | B | A | A | A |
| CTE | 2 | 2 | 3 | 1 | 2 | 2 | 2 | 2 | 2 | 2 |
| Sealant material adhesiveness | A | A | A | B | A | A | A | A | C | C |
| Underfill adhesiveness | A | A | A | A | A | A | A | A | B | B |
| Sputter copper adhesiveness | A | A | A | B | A | A | A | A | C | C |
| HAST resistance | A | A | A | A | A | A | A | A | A | A |
| Crack resistance | A | A | A | B | A | A | A | A | A | A |

TABLE 3

| Item | Example 9 | Example 10 | Example 11 | Example 12 | Comparative Example 3 |
|---|---|---|---|---|---|
| Photosensitive resin | E | F | A | A | A |
| Support film | A | A | G | H | I |
| Protective film | A | A | A | A | A |
| Ra [nm] | 370 | 370 | 1022 | 2339 | Evaluation impossible |
| Sensitivity | A | A | A | A | B |
| Resolution | 40 | 50 | 50 | 50 | 50 |
| Support film peelability | A | A | A | A | C |
| CTE | 2 | 2 | 2 | 2 | Evaluation impossible |
| Sealant material adhesiveness | A | A | A | A | Evaluation impossible |
| Underfill adhesiveness | A | A | A | A | Evaluation impossible |
| Sputter copper adhesiveness | A | A | A | A | Evaluation impossible |
| HAST resistance | A | A | A | A | Evaluation impossible |
| Crack resistance | A | B | A | A | Evaluation impossible |

From the test results of Examples 1 to 12 and Comparative Examples 1 to 3, roughness of the support film could be transferred by applying a photosensitive insulating layer on a support film in which the surface roughness (Ra) of the surface that was in contact with the photosensitive layer was in the range of 200 to 4,000 nm.

When the roughness of the support film is transferred to the photosensitive layer, surface roughness of the photosensitive layer is increased. That is, a satisfactory anchoring effect can be obtained, and it is speculated that adhesiveness with the semiconductor material such as the underfill or the sealant material has been increased.

111 CONNECTION TERMINAL FOR SOLDER INTERCONNECTION
112 OPENING
114 SOLDER BALL
115 GOLD WIRE
116 SEALANT RESIN FOR SEMICONDUCTOR
117 ADHESIVE
118 UNDERFILL AGENT
120 SEMICONDUCTOR CHIP

The invention claimed is:

1. A photosensitive element comprising a support film, and a photosensitive layer provided on the support film and formed from a photosensitive resin composition, wherein in the support film, the surface roughness Ra of the surface that is in contact with the photosensitive layer is larger than 500 nm and 4000 nm or less, wherein the photosensitive resin composition includes an acylphosphine-based compound and includes an inorganic filler material comprising at least one of barium sulfate and silica filler and having an average particle size of 1 μm or less at a proportion of 10% to 90% by mass based on the total amount of the photosensitive resin composition, wherein the photosensitive resin composition does not contain a black pigment component, and wherein the support film has a haze of 60% or higher.

2. The photosensitive element according to claim 1, wherein the photosensitive resin composition includes a polyfunctional epoxy resin.

3. The photosensitive element according to claim 1, wherein the photosensitive resin composition include a photoreactive compound having a (meth)acryloyl group.

4. The photosensitive element according to claim 1, wherein the acylphosphine-based compound is 2,4,6-trimethylbenzoyl-diphenyl-phosphine oxide.

5. The photosensitive element according to claim 1, wherein the photosensitive resin composition further includes a biphenyl aralkyl type epoxy resin.

6. The photosensitive element according to claim 1, wherein the photosensitive resin composition further includes an epoxy-modified polybutadiene rubber derivative.

7. The photosensitive element according to claim 1, wherein the photosensitive resin composition further comprises a blue pigment.

8. The photosensitive element according to claim 1, wherein the support film has a haze of 70% or higher.

9. The photosensitive element according to claim 1, wherein the inorganic filler material comprises barium sulfate.

10. The photosensitive element according to claim 1, wherein the inorganic filler material comprises silica filler.

11. The photosensitive element according to claim 1, wherein a content of the inorganic filler material is 20% to 80% by mass based on the total amount of the photosensitive resin composition.

12. The photosensitive element according to claim 1, wherein a content of the inorganic filler material is 30% to 70% by mass based on the total amount of the photosensitive resin composition.

13. A method for forming a permanent mask resist, the method comprising:
    a step of forming a photosensitive layer on a substrate using the photosensitive element according to claim 1;
    a step of irradiating a predetermined part of the photosensitive layer with active light rays, and forming a photocured part; and
    a step of removing regions other than the photocured part.

14. The method for forming a permanent mask resist according to claim 13, further comprising a step of peeling a support film, after the step of forming the photosensitive layer and before the step of forming the photocured part.

15. The method for forming a permanent mask resist according to claim 13, wherein in the step of forming the photocured part, the photosensitive layer is irradiated with active light rays using a direct drawing system, a projection exposure system, or an exposure system by which a negative mask is disposed such that the negative mask is not brought into direct touch with the photosensitive layer.

16. The method for forming a permanent mask resist according to claim 13, further comprising a step of heating, after the step of removing regions other than the photocured part.

17. A permanent mask resist formed by the method for forming a permanent mask resist according to claim 13.

18. A method for producing a semiconductor package, the method comprising a step of forming other members on a substrate on which a permanent mask resist has been formed by the method for forming a permanent mask resist according to claim 13.

19. A laminate comprising a substrate; and a cured product obtained by curing the photosensitive layer of the photosensitive element according to claim 1 on the substrate.

* * * * *